(12) United States Patent
Riedlinger et al.

(10) Patent No.: US 6,208,565 B1
(45) Date of Patent: Mar. 27, 2001

(54) MULTI-PORTED REGISTER STRUCTURE UTILIZING A PULSE WRITE MECHANISM

(75) Inventors: Reid James Riedlinger, Fort Collins; Donald R Weiss, Ft Collins, both of CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/507,333

(22) Filed: Feb. 18, 2000

(51) Int. Cl.$^7$ ................................................. G11C 7/00
(52) U.S. Cl. ................. 365/189.12; 365/154; 365/156; 365/230.05
(58) Field of Search ................................. 365/154, 156, 365/190, 189.12, 230.05

(56) References Cited

U.S. PATENT DOCUMENTS 5,477,502 * 12/1995 Hayashi ............................... 365/156
5,894,432 * 4/1999 Lotfi ...................................... 365/154

* cited by examiner

Primary Examiner—Vu A. Le (57) ABSTRACT

A system and method are disclosed which provide a pulse write mechanism to enable a port to write to a register structure without requiring a large amount of circuitry. One or more ports may be coupled to a register structure in a manner that enables the ports to write data to the register structure without requiring a large amount of circuitry. The ports may be coupled to the register structure in a manner that enables them the capability of reading data from the register structure without requiring additional circuitry beyond that required for a write operation. A preferred embodiment implements a single-ended write structure, wherein a data carrier (e.g., BIT line) is utilized to carry a data value desired to be written for a port. A preferred embodiment comprises a write pulse mechanism, such as a NFET, capable of setting the memory cell to an initial value before performing a write thereto. Before performing a write operation to a memory cell, the write pulse signal is fired causing the write pulse mechanism to initialize the memory cell to a high voltage value. If the value of the BIT line is the same as the value to which the memory cell was initialized, the memory access mechanism enables the memory cell to remain at such value. However, if the value of the BIT line is different than the initial value of the memory cell, the memory access mechanism transitions the memory cell to the value of the BIT line.

20 Claims, 3 Drawing Sheets

MULTI-PORTED REGISTER STRUCTURE UTILIZING A PULSE WRITE MECHANISM

RELATED APPLICATIONS

This application is related to co-pending and commonly assigned patent application Ser. No. 09/505,561 entitled "SYSTEM AND METHOD FOR ENABLING/DISABLING SRAM BANKS FOR MEMORY ACCESS," and co-pending and commonly assigned U.S. patent application Ser. No. 09/507,207 entitled "REGISTER STRUCTURE WITH A DUAL-ENDED WRITE MECHANISM," the disclosures of which are hereby incorporated herein by reference.

TECHNICAL FIELD

This invention is related in general to a register structure comprising at least one port for performing a memory access of a memory cell, and in specific to a register structure utilizing a pulse write mechanism to enable one or more ports to be coupled to a memory cell for performing write operations thereto by implementing a small amount of circuitry for coupling such one or more ports to such memory cell.

BACKGROUND

Computer systems may employ a multi-level hierarchy of memory, with relatively fast, expensive but limited-capacity memory at the highest level of the hierarchy and proceeding to relatively slower, lower cost but higher-capacity memory at the lowest level of the hierarchy. At the highest level of the memory hierarchy, computers commonly have register structures implemented, which are typically limited in capacity but provide very fast access thereto. Such register structures may be referred to as "register files," and various such register structures may be implemented for a system, such as an integer register structure and floating point register structure. A register structure enables high speed memory access, and is typically capable of satisfying a memory access request (e.g., a read or write request) in one clock cycle (i.e., one processor clock cycle). Various lower levels of memory may be implemented including a small fast memory called a cache, either physically integrated within a processor or mounted physically close to the processor for speed, as well as the main memory (e.g., the disk drive) of a computer system.

Static random access memory (SRAM) is typically implemented for register structures of a computer system for storing data therein. Generally, SRAM memory is a type of memory that is very reliable and very fast. Unlike dynamic random access memory (DRAM), SRAM does not need to have its electrical charges constantly refreshed. As a result, SRAM memory is typically faster and more reliable than DRAM memory.

Unfortunately, SRAM memory is generally much more expensive to produce than DRAM memory. Due to its high cost, SRAM is typically implemented only for the most speed-critical parts of a computer, such as for register structures. However, SRAM memory may be implemented for other memory components of a computer system, as well. Moreover, types of memory other than SRAM (e.g., other types of RAM) may be implemented within a computer system for a register structure.

To enable greater efficiency in processing instructions, multiple ports are commonly implemented within a computer system. For instance, multiple ports may be implemented such that each port is capable of satisfying a memory access request (e.g., a read or write instruction) in parallel with the other ports satisfying such a memory access request.

Accordingly, various register structures have been developed to enable access thereto by multiple ports. That is, multi-ported register structures are commonly implemented in the prior art to enable multiple ports to access the register structure to satisfy a memory access request.

Figure 1A:
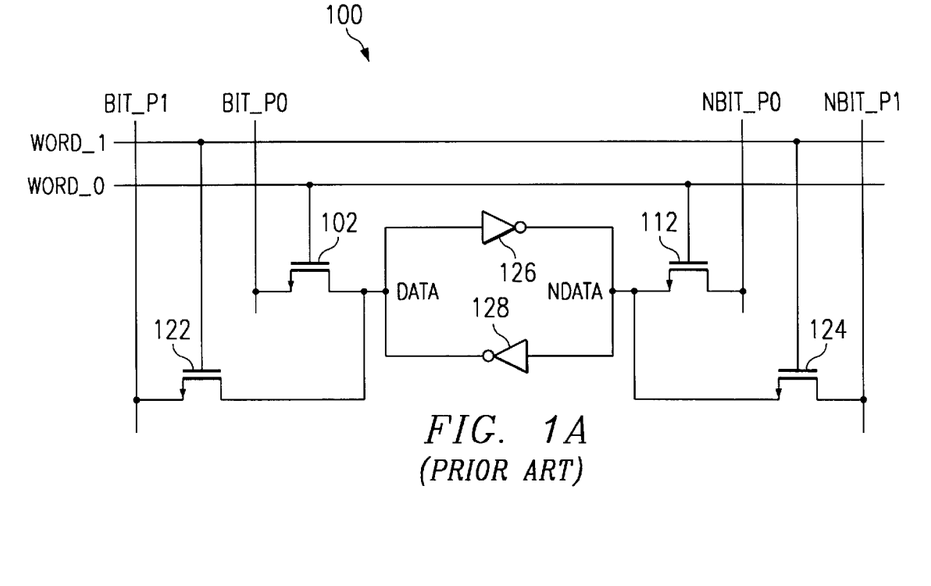
FIG. 1A shows a prior art multi-ported register structure that performs a dual-ended write.

Register structures of the prior art are typically implemented with dual-ended writes through an N-channel field effect transistor (NFET) into a latch. FIG. 1A illustrates a typical dual-ended SRAM cell 100 of the prior art. The multi-ported SRAM structure of FIG. 1A comprises a typical SRAM cell comprising cross-coupled inverters 126 and 128 for storing data (i.e., for storing one bit of data). Additionally, NFETs 102 and 112 are provided, which enable writes from a first port (i.e., port 0). That is, a write is accomplished to the SRAM cell by passing a voltage level across NFETs 102 and 112 into the cross-coupled inverters 126 and 128. Also, a second port (i.e., port 1) is coupled to the SRAM cell 100 by implementing NFETs 122 and 124, which enable writes from the second port to the SRAM cell 100. The multi-ported SRAM structure 100 of FIG. 1A is well-known in the art and is commonly implemented in integrated circuits of the prior art. The SRAM cell 100 of FIG. 1A is a memory cell capable of storing one bit of data (i.e., a logic 1 or a logic 0). Thus, many of such SRAM cells 100 are typically implemented within a system to provide the desired amount of SRAM memory.

Either of the two ports (i.e., port 0 and port 1) coupled to the SRAM cell 100 may write data into the cell to satisfy a memory access request (e.g., a memory write request). As shown, BIT_P0, NBIT_P0, and WORD_0 lines are implemented to enable a write for port 0 to the SRAM cell 100, and BIT_P1, NBIT_P1, and WORD_1 lines are implemented to enable a write for port 1 to the SRAM cell 100. The BIT_P0 and BIT_P1 lines may be referred to herein as data carriers for port 0 and port 1, respectively, and the NBIT_P0 and NBIT_P1 lines may be referred to herein as complementary data carriers for port 0 and port 1, respectively. The operation of this prior art implementation is well known in the prior art, and therefore will be described only briefly herein. Typically, the BIT_P0 and BIT_P1 lines are held to a high voltage level (i.e., a logic 1), unless one of them is actively pulled to a low voltage level (i.e., a logic 0). For instance, when writing data from port 0 to the SRAM cell 100, the BIT_P0 line is actively driven low by an outside source (e.g., an instruction being executed by the processor) if the outside source desires to write a 0 to the SRAM cell 100, and the NBIT_P0 line is held to a high voltage level (the opposite of BIT_P0). Otherwise, if an outside source desires to write a 1 to the SRAM cell 100, the BIT_P0 line remains high and the NBIT_P0 line is pulled low. Thereafter, the WORD_0 line is fired (e.g., caused to go to a high voltage level), at which time the value of the BIT_P0 line is written into the SRAM cell 100. More specifically, the voltage level of BIT_P0 is transferred across NFET 102 and the voltage level of NBIT_P0 is transferred across NFET 112 to accomplish a write of the value of BIT_P0 to DATA of the cross-coupled inverters 126 and 128.

A similar operation is performed when writing data from port 1 to the SRAM cell 100. For instance when writing data from port 1 to the SRAM cell 100, the BIT_P1 line is actively driven low by an outside source (e.g., an instruction being executed by the processor) if the outside source desires to write a 0 to the SRAM cell 100, and the NBIT_P1 line is held to a high voltage level (the opposite of BIT_P1). Otherwise, if an outside source desires to write a 1 to the SRAM cell 100, the BIT_P1 line remains high and the NBIT_P1 line is pulled low. Thereafter, the WORD_1 line is fired, at which time the value of the BIT_P1 line is written into the SRAM cell 100. More specifically, the voltage level of BIT_P1 is transferred across NFET 122 and the voltage level of NBIT_P1 is transferred across NFET 124 to accomplish a write of the value of BIT_P1 to DATA of the cross-coupled inverters 126 and 128. The data value written into the SRAM cell 100 (e.g., a logic 0 or logic 1) is shown as DATA in FIG. 1A, and the complement of such value is shown as NDATA. The SRAM register structure illustrated in FIG. 1A is referred to as a dual-ended write structure because it utilizes both a data carrier (e.g., a BIT line) and a complementary data carrier (e.g., a NBIT line) to write a data value into the SRAM cell 100. For instance, it requires BIT_P0 and NBIT_P0 to write a value to the SRAM cell 100 from port 0, and it requires BIT_P1 and NBIT_P 1 to write a value to the SRAM cell 100 from port 1.

Typically, multiple SRAM cells, such as SRAM cell 100, are connected to a single data carrier (e.g., BIT line) and a single complementary data carrier (e.g., NBIT line) for a port. Accordingly, a single BIT line may be utilized to carry data to/from multiple ones of SRAM cells 100 for a port. Therefore, even though only SRAM cell 100 is shown, it should be understood that many such SRAM cells may be connected to the BIT_P0 and NBIT_P0 lines for port 0, as well as to the BIT_P1 and NBIT_P1 lines for port 1, to form a group of SRAM cells. Additionally, it should be recognized that additional ports may be coupled to the SRAM cell 100. Thus, even though only two ports (port 0 and port 1) are shown as being coupled to SRAM cell 100, SRAM cell 100 may have any number of ports coupled thereto.

In general, it is desirable to have a large number of ports coupled to each SRAM cell 100 in order to increase the number of instructions that may be processed in parallel, and thereby increase the efficiency of a system.

The dual-ended register structure illustrated in FIG. 1A is problematic in that it requires an undesirably large amount of surface area for its implementation. That is, an undesirably large number of components and high-level metal tracks are required to be implemented for each port coupled to the SRAM cell to perform write operations. For example, the metal tracks for implementing BIT_P0, NBIT_P0, WORD_0, BIT_P1, NBIT_P1 and WORD_1 are typically high-level metal tracks that span several register structures. Such high-level metal tracks are commonly referred to as "metal-two tracks" or "metal-three tracks," whereas lower-level metal tracks that are implemented within a single register structure, for example, are commonly referred to as "metal-one tracks." Because of the size and spacing requirements of high-level tracks, such high-level tracks often require a relatively large amount of surface area. Typically, high-level tracks consume more surface area than is required for the component parts (e.g., FETs) of a register structure. That is, a small device geometry process may be utilized for the component parts of a register structure, such as FETs, wherein the component parts may require much less surface area than the amount of surface area required for implementing the high-level metal tracks for a register structure. For example, in a small device geometry process commonly used today, component parts of a register structure may be approximately 0.18 micron in process size (i.e., the actual drawn size for the component parts). Additionally, the component parts (e.g., FETs) of a register structure may typically be implemented below the high-level metal tracks. Accordingly, the high-level tracks implemented for register structure 100 typically dictate the amount of surface area required for such register structure. As a result it becomes desirable to limit the number of high-level metal tracks that are required to be implemented in order to reduce the overall surface area required for the register structure. More specifically, it is desirable to provide an optimum number of high-level metal tracks that require the minimum amount of surface area below which the actual components of a register structure may be implemented. Ideally, the number of high-level metal tracks required for a register structure design would require no more than the surface area required to implement the actual components (e.g., FETs) of the register structure.

In this prior art implementation, two FETs and three high-level lines are required to be implemented for each port that is coupled to the SRAM cell 100. As shown in FIG. 1A, two FETs (i.e., NFETs 122 and 124) are required to be implemented to enable port 1 to be coupled to the SRAM cell 100 for write operations. Additionally, high-level wires or metal traces must be implemented for three lines for port 1 (i.e., BIT_P1, NBIT_P1, and WORD_1). Therefore, if a third port were implemented for the SRAM cell 100, two additional FETs and three additional high-level lines (i.e., BIT_P2, NBIT_P2, and WORD_2) would be required to be added to the design of FIG. 1A. As a result, the prior art multi-ported structure of FIG. 1A is undesirable because it requires an undesirably large number of components and high-level lines to be implemented for each port coupled to the SRAM cell 100. Thus, the prior art implementation of FIG. 1A results in an undesirably high cost and an undesirably large consumption of surface area for each port implemented therein.

Figure 1B:
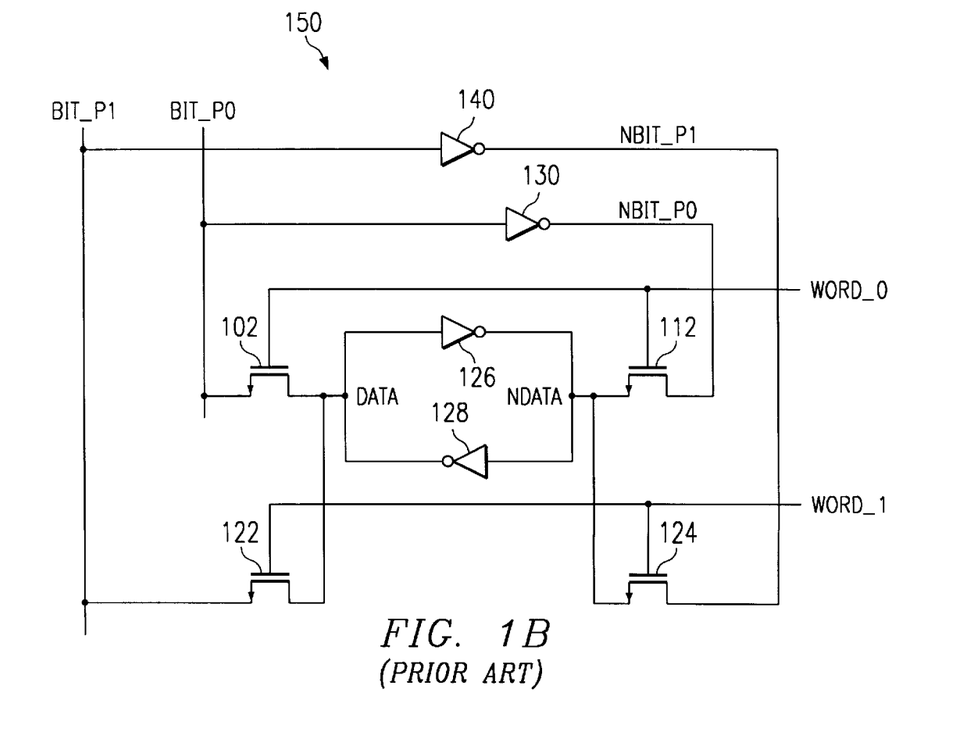
FIG. 1B shows another prior art multi-ported register structure that performs a dual-ended write.

Turning to FIG. 1B, a second implementation of a prior art register structure is illustrated. The implementation of FIG. 1B is a dual-ended write structure much like the register structure described above in FIG. 1A, except the register structure of FIG. 1B includes an inverter, such as inverter 130, within the individual SRAM cell 150 to locally generate a NBIT signal for a port, thereby reducing the total number of high-level metal tracks required for each port. The multi-ported SRAM structure of FIG. 1B includes a typical SRAM cell 150 comprising cross-coupled inverters 126 and 128 for storing data (i.e., one bit of data) within the SRAM cell 150. As with the implementation of FIG. 1A, the structure of FIG. 1B further comprises NFETs 102 and 112, which enable writes to the memory cell from a first port (i.e., port 0). Also, a second port (i.e., port 1) is coupled to the SRAM cell 150 by implementing NFETs 122 and 124. The multi-ported SRAM structure 150 of FIG. 1B is also well-known in the art and is commonly implemented in integrated circuits of the prior art.

Either of the two ports (i.e., port 0 and port 1) coupled to the SRAM cell 150 may write data into the cell to satisfy a memory access request (e.g., a memory write request). As shown, high-level lines BIT_P0 and WORD_0 and low-level line NBIT_P0 are implemented to enable a write for port 0 to the SRAM cell 150, and high-level lines BIT_P1 and WORD_1 and low-level line NBIT_P1 are implemented to enable a write for port 1 to the SRAM cell 150. The operation of this prior art implementation is well known in the prior art, and therefore will be described only briefly herein. Typically, the BIT_P0 and BIT_P1 lines are held to a high voltage level (i.e., a logic 1), unless one of them is actively pulled to a low voltage level (i.e., a logic 0). For instance, when writing data from port 0 to the SRAM cell 150, the BIT_P0 line is actively driven low by an outside source (e.g., an instruction being executed by the processor) if the outside source desires to write a 0 to the SRAM cell 150, and the NBIT_P0 line is held to a high voltage level (the opposite of BIT_P0). Otherwise, if an outside source desires to write a 1 to the SRAM cell 150, the BIT_P0 line remains high and the NBIT_P0 line is pulled low. Thereafter, the WORD_0 line is fired (e.g., caused to go to a high voltage level), at which time the value of the BIT_P0 line is written into the SRAM cell 150. More specifically, the voltage level of BIT_P0 is transferred across NFET 102 and the voltage level of NBIT_P0 is transferred across NFET 112 to accomplish a write of the value of BIT_P0 to DATA of the cross-coupled inverters 126 and 128.

A similar operation is performed when writing data from port 1 to the SRAM cell 150. For instance when writing data from port 1 to the SRAM cell 150, the BIT_P1 line is actively driven low by an outside source (e.g., an instruction being executed by the processor) if the outside source desires to write a 0 to the SRAM cell 150, and the NBIT_P1 line is held to a high voltage level (the opposite of BIT_P1). Otherwise, if an outside source desires to write a 1 to the SRAM cell 150, the BIT_P1 line remains high and the NBIT_P1 line is pulled low. Thereafter, the WORD_1 line is fired, at which time the value of the BIT_P1 line is written into the SRAM cell 100. The data value written into the SRAM cell 150 (e.g., a logic 0 or logic 1) is shown as DATA in FIG. 1B, and the complement of such value is shown as NDATA. As with the register structure of FIG. 1A, the SRAM register structure illustrated in FIG. 1B is referred to as a dual-ended write structure because it utilizes both a data carrier (e.g., a BIT line) and a complementary data carrier (e.g., a NBIT line) to write a data value into the SRAM cell 150. For instance, it requires a data carrier (e.g., a BIT_P0) and a complementary data carrier (e.g., NBIT_P0) to write a value to the SRAM cell 150 from port 0, and it requires a data carrier (e.g., BIT_P1) and a complementary data carrier (e.g., NBIT_P1) to write a value to the SRAM cell 150 from port 1. In this implementation, an inverter is included within the SRAM cell 150 to generate each NBIT signal. For example, inverter 130 is implemented to invert the BIT_P0 signal, thereby generating NBIT_P locally, and inverter 140 is implemented to invert the BIT_P1 signal, thereby generating NBIT_P1 locally.

Typically, multiple SRAM cells, such as SRAM cell 150, are connected to a single data carrier (e.g., BIT line) for a port. Accordingly, a single BIT line may be utilized to carry data to/from multiple ones of SRAM cells 150 for a port. Therefore, even though only SRAM cell 150 is shown, it should be understood that many such SRAM cells may be connected to the BIT_P0 line for port 0, as well as to the BIT_P1 line for port 1, to form a group of SRAM cells. Additionally, it should be recognized that additional ports may be coupled to the SRAM cell 150. Thus, even though only two ports (port 0 and port 1) are shown as being coupled to SRAM cell 150, SRAM cell 150 may have any number of ports coupled thereto. Again, it is generally desirable to have a large number of ports coupled to each SRAM cell 150 in order to increase the number of instructions that may be processed in parallel, and thereby increase the efficiency of a system.

The dual-ended register structure illustrated in FIG. 1B is problematic in that it requires an undesirably large number of components to be implemented for each port coupled to the SRAM cell to perform write operations. In this prior art implementation, two FETs, one inverter, and two high-level lines are required to be implemented for each port that is coupled to the SRAM cell 150. As shown in FIG. B, two FETs (i.e., NFETs 122 and 124) are required to be implemented to enable port 1 to be coupled to the SRAM cell operations. Additionally, one inverter (i.e., inverter 140) is required to generate NBIT_P1 for performing a write operation for port 1. Furthermore, high-level wires or metal traces must be implemented for two lines for port 1 (i.e., BIT_P1 and WORD_1). Therefore, if a third port were implemented for the SRAM cell 150, two additional FETs, one additional inverter, and two additional high-level lines (i.e., BIT_P2 and WORD_2) would be required to be added to the design of FIG. 1B. As a result, the prior art multi-ported structure of FIG. 1B is undesirable because it requires an undesirably large number of components and high-level lines to be implemented for each port coupled to the SRAM cell 150. In fact, the prior art implementation of FIG. 1B requires more components than is required for the implementation of FIG. 1A because FIG. 1B requires an inverter to be included for each port coupled to the SRAM cell 150 in order to locally generate the appropriate NBIT signals required for writing data from a port. Thus, the prior art implementation of FIG. 1B results in an undesirably high cost and an undesirably large consumption of surface area for each port implemented therein. Additionally, the components illustrated in FIG. 1B only enable a write from each port to the register structure, and do not allow a read for each port from the register structure. That is, additional circuitry (e.g., additional FETs) is required to be implemented to enable a read to be accomplished for each port from the register structure, which would further increase the surface area, cost, and complexity of the design.

Figure 2:
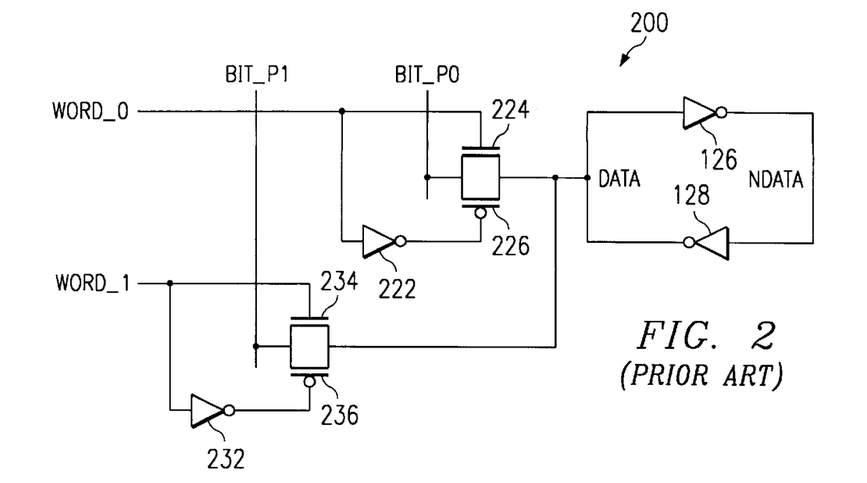
FIG. 2 shows a further prior art multi-ported register structure that implements a transfer gate to perform a single-ended write.

FIG. 2 provides another exemplary implementation for a register structure of the prior art. The implementation of FIG. 2 provides a single-ended write structure. As shown, a full transfer gate is implemented that enables a full voltage level to be written from the BIT line of a port. Therefore, a complementary data carrier (e.g., a NBIT line) is not required to perform a write for a port. That is, rather than a portion of the voltage level being supplied by the BIT line and a portion being supplied by the NBIT line as in dual-ended write structures, in the single-ended write structure the full voltage level is written to the memory cell from the BIT line.

More specifically, the implementation of FIG. 2 comprises cross-coupled inverters 126 and 128 for storing data (i.e., one bit of data) within the SRAM cell 200. The structure further includes a transfer gate comprising NFET 224 and P-Channel FET (PFET) 226 for writing data from port 0 to the memory cell 200. As shown, WORD_0 controls NFET 224, and WORD_0 is inverted by inverter 222, the output of which controls PFET 226. In operation, when writing data from port 0 to the SRAM cell 200, the BIT_P0 line is actively driven low by an outside source (e.g., an instruction being executed by the processor) if the outside source desires to write a 0 to the SRAM cell 200. Otherwise, if an outside source desires to write a 1 to the SRAM cell 200, the BIT_P0 line remains high. Thereafter, the WORD_0 line is fired, at which time the value of the BIT_P0 line is written into the SRAM cell 200 via NFET 224 and PFET 226. The data value written into the SRAM cell 200 (e.g., a logic 0 or logic 1) is shown as DATA in FIG. 2, and the complement of such value is shown as NDATA.

It should be recognized that a transfer gate comprising NFET 234 and PFET 236 is implemented for port 1 to enable port 1 to write data to the memory cell 200. As shown, BIT_P1 and WORD_1 lines are implemented for port 1.

The WORD_1 line controls NFET 234, and WORD_1 is inverted by inverter 232, the output of which controls PFET 236. In operation, when writing data from port 1 to the SRAM cell 200, the BIT_P1 line is actively driven low by an outside source (e.g., an instruction being executed by the processor) if the outside source desires to write a 0 to the SRAM cell 200. Otherwise, if an outside source desires to write a 1 to the SRAM cell 200, the BIT_P1 line remains high. Thereafter, the WORD_1 line is fired, at which time the value of the BIT_P1 line is written into the SRAM cell 200 via the transfer gate comprising NFET 234 and PFET 236.

A single-ended register structure, as implemented in FIG. 2, is generally more desirable than a dual-ended register structure because one less line is required to perform a write for each port. That is, only a BIT line, as opposed to both a BIT and NBIT line, is required to perform a write from a port to a memory cell 200. However, the single-ended register structure illustrated in FIG. 2 is problematic in that it requires an undesirably large number of components to be implemented for each port coupled to the SRAM cell to perform write operations. In this prior art implementation, two FETs, one inverter, and two high-level lines are required to be implemented for each port that is coupled to the SRAM cell 200. As shown in FIG. 2, two FETs (i.e., NFET 234 and PFET 236) are required to be implemented to enable port 1 to be coupled to the SRAM cell 200 for write operations. Additionally, one inverter (i.e., inverter 232) is required to be implemented to invert the WORD_1 signal for controlling PFET 236 to enable a write operation for port 1. Furthermore, high-level wires or metal traces must be implemented for two lines for port 1 (i.e., BIT_P1 and WORD_1).

Therefore, if a third port were implemented for the SRAM cell 200, two additional FETs, one additional inverter, and two additional high-level lines (i.e., BIT_P2 and WORD_2) would be required to be added to the design of FIG. 2. As a result, the prior art multi-ported structure of FIG. 2 is undesirable because it requires an undesirably large number of components and lines to be implemented for each port coupled to the SRAM cell 200. Thus, the prior art implementation of FIG. 2 results in an undesirably high cost and an undesirably large consumption of surface area for each port implemented therein. Additionally, the components illustrated in FIG. 2 only enable a write from each port to the register structure, and do not allow a read for each port from the register structure. That is, additional circuitry (e.g., additional FETs) is required to be implemented to enable a read to be accomplished for each port from the register structure, which would further increase the surface area, cost, and complexity of the design.

Figure 3:
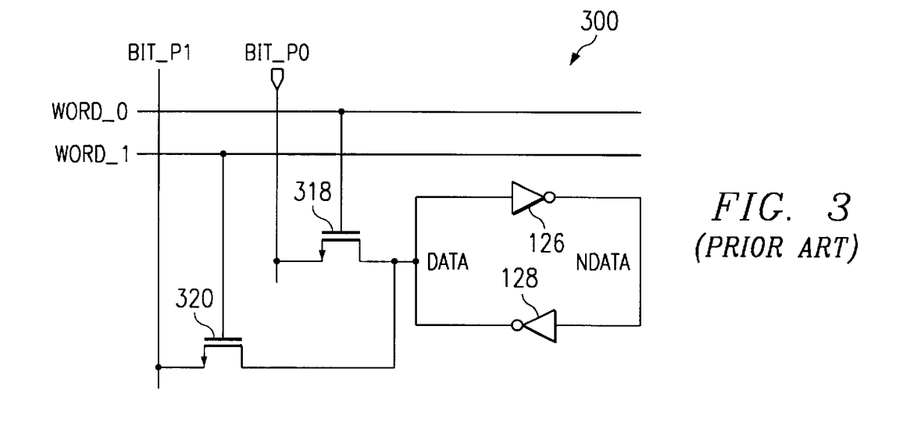
FIG. 3 shows still a further multi-ported register structure that performs a single-ended write.

Turning to FIG. 3, a further prior art implementation for a multi-ported register structure is shown. The implementation of FIG. 3 provides a single-ended write structure that enables a value to be written from the BIT line without requiring a NBIT line to perform a write. In this implementation, a regular NFET jam latch is utilized, and data is written into the register structure from port 0 through the NFET 318 and from port 1 through NFET 320.

More specifically, the implementation of FIG. 3 comprises cross-coupled inverters 126 and 128 for storing data (i.e., for storing one bit of data) within the SRAM cell 300. The structure further includes a NFET 318 for writing data from port 0 (i.e., from the BIT_P0 line) to the memory cell 200. As shown, WORD_0 controls NFET 318 to write data from the BIT_P0 line to the memory cell 300.

In operation, when writing data from port 0 to the SRAM cell 300, the BIT_P0 line is actively driven low by an outside source (e.g., an instruction being executed by the processor) if the outside source desires to write a 0 to the SRAM cell 300. Otherwise, if an outside source desires to write a 1 to the SRAM cell 300, the BIT_P0 line remains high. Thereafter, the WORD_0 line is fired, at which time the value of the BIT_P0 line is written into the SRAM cell 300 via NFET 318. The data value written into the SRAM cell 300 (e.g., a logic 0 or logic 1) is shown as DATA in FIG. 3, and the complement of such value is shown as NDATA. The multi-ported register of FIG. 3 also includes NFET 320, which is implemented for port 1 to enable port 1 to write data to the memory cell 300. As shown, BIT_P1 and WORD_1 lines are implemented for port 1. The WORD_1 line controls NFET 320 to write data from the BIT_P1 line to the memory cell 300. In operation, when writing data from port 1 to the SRAM cell 300, the BIT_P1 line is actively driven low by an outside source (e.g., an instruction being executed by the processor) if the outside source desires to write a 0 to the SRAM cell 300. Otherwise, if an outside source desires to write a 1 to the SRAM cell 300, the BIT_P1 line remains high. Thereafter, the WORD_1 line is fired, at which time the value of the BIT_P1 line is written into the SRAM cell 300 via NFET 320. It should be recognized that when a port is writing a 1 to the register structure 300, NFET 318 is required to write a weak 1 to the cross-coupled inverters 126 and 128.

A single-ended register structure, as implemented in FIG. 3, is generally more desirable than a dual-ended register structure because one less line is required to perform a write for each port. That is, only a data carrier (e.g., a BIT line), as opposed to both a data carrier and a complementary data carrier (e.g., a NBIT line), is required to perform a write from a port to a memory cell 300. Furthermore, the prior art multi-ported register structure of FIG. 3 is one of the most desirable prior art solutions because of the relatively small amount of circuitry required to be implemented to couple an additional port for writing to the memory cell 300. More specifically, the prior art solution of FIG. 3 only requires one FET and two high-level lines to be implemented for each port coupled to the SRAM cell 300 to perform write operations. For example, only one FET (i.e., NFET 320) is required to be implemented to enable port 1 to be coupled to the SRAM cell 300 for write operations. Additionally, high-level wires or metal traces must only be implemented for two lines for port 1 (i.e., BIT_P1 and WORD_1). Therefore, if a third port were implemented for the SRAM cell 300, only one additional FET and only two additional high-level lines (i.e., BIT_P2 and WORD_2) would be required to be added to the design of FIG. 3. As a result, the prior art multi-ported structure of FIG. 3 is a more desirable implementation than other prior art solutions because it requires a fewer number of components and high-level lines to be implemented for each port coupled to the SRAM cell 300. Therefore, multiple ports can be coupled to the structure of FIG. 3 in a manner that is less costly and consumes less surface area than in other prior art solutions.

However, the multi-ported register structure illustrated in FIG. 3 is problematic in that it fails to reliably write data for a port when the structure is implemented using small device geometries commonly implemented today. That is, when the multi-ported register structure of FIG. 3 is implemented within small device geometries the write margin decreases to an unacceptable level, thereby resulting in difficulty in writing data to the memory cell. For example, when implemented in a small device geometry, the supply voltage to the gate of the NFET used to write data into the memory cell (e.g., NFET 320) is reduced, and therefore the threshold voltage across such NFET becomes a greater percentage of the supply voltage for the NFET. Therefore, the implementation of FIG. 3 is undesirable in that the write margin decreases to an unacceptable level when implemented within a small device geometry process that is common today.

In view of the above, prior art designs are problematic because typically as the number of ports in the design increases, the number of FETs increases, thereby consuming significantly more surface area, consuming more power, and resulting in added cost to increase the number of ports in a design. That is, prior art designs typically require a relatively large number of additional FETs in order to add an additional port to the design. In addition, dual-ended write structures typically require more high-level lines (e.g., both a BIT and NBIT line) for each port implemented, which further increase the cell size and load of the design. Additionally, many register structures of the prior art require additional circuitry for enabling a read operation for a port coupled to the register structure beyond what is required for a write operation. Therefore, to enable a port to be capable of reading from and writing to a register structure, the surface area, cost, and complexity of many prior art designs increase.

Increased cell size equates directly into reduced speed and increased cost of the register. Furthermore, as geometries and voltages decrease for a register structure, some prior art designs fail to be dependable for write operations. Also, as the geometries and voltages decrease for a register structure, potential for Soft Error Rate (SER) and Silent Data Corruption (SDC) occurring increases in prior art designs. These errors are generally caused by alpha particles hitting the diffusion on the storage element. With the relatively large number of FETs coupled to the diffusion, as is typically implemented in conventional dualended writes and full transfer gate designs of the prior art, the SER and SDC problems increase.

SUMMARY OF THE INVENTION

In view of the above, a desire exists for a register structure that enables multiple ports to be coupled to the register structure for performing memory access thereof (e.g., a memory write operation and/or a memory read operation). A further desire exists for a register structure that requires a relatively small number of components to be implemented for coupling a port to a memory cell for performing write operations. A further desire exists for a register structure that requires a relatively small number of high-level lines (e.g., wires or metal traces) to be implemented for enabling a port to be capable of performing write operations to a memory cell. Accordingly, a desire exists for a register structure that consumes relatively small amount of surface area for coupling a port to a memory cell for performing write operations. Furthermore, a desire exists for a register structure in which implementing a port for performing write operations to a memory cell is cost efficient. Yet a further desire exists for a register structure that enables reliable writes to be performed in a low voltage, small device geometry process. Still a further desire exists for a register structure that enables reliable reads to be performed by a port coupled to a register structure without requiring a large amount of additional circuitry to be implemented beyond that required for enabling the port to be capable of writing to the register structure.

These and other objects, features and technical advantages are achieved by a system and method which provide a pulse write mechanism to enable a port to write to a register structure without requiring a large amount of circuitry to be implemented for such port to achieve a write thereto. Accordingly, in a preferred embodiment, one or more ports may be coupled to a register structure in a manner that enables the ports the capability of writing data to the register structure without requiring a large amount of circuitry to be implemented for enabling each port such capability. Additionally, in a preferred embodiment, one or more ports may be coupled to a register structure in a manner that enables the ports the capability of reading data from the register structure without requiring additional circuitry beyond that required for enabling the ports to perform a write to the register structure.

In a preferred embodiment, a register structure is provided that comprises a memory cell, which most preferably is a SRAM memory cell. For example, in a most preferred embodiment, the memory cell comprises cross-coupled inverters arranged for storing one bit of data. Additionally, a preferred embodiment comprises at least one port coupled to the register structure in a manner such that the at least one port is capable of performing a memory access of the memory cell (e.g., a memory write and/or a memory read). A preferred embodiment implements a single-ended write structure, wherein a data carrier (e.g., a BIT line) is utilized to carry a data value for a port. More specifically, in a preferred embodiment, a BIT line is implemented for each port. For example, a first port may have a BIT_P0 line implemented therefor and a second port may have a BIT_P1 line implemented therefor, etcetera. In a preferred embodiment, a memory access mechanism is coupled to each BIT line to enable data from the BIT line of a port to be written to the memory cell of the register structure. Most preferably, such memory access mechanism is a transfer gate (e.g., a NFET) coupled to a BIT line of a port. Additionally, in a preferred embodiment, the transfer gate (e.g., NFET) is arranged to enable the BIT line to be set to the voltage level of the data stored within the memory cell, thereby enabling a port associated with such BIT line to read the data of the memory cell.

Additionally, a preferred embodiment comprises a write pulse mechanism (or reset mechanism) that is capable of setting the value of the memory cell to an initial value before performing a write to such memory cell from a port. Most preferably, the write pulse mechanism is a NFET that is controlled by a write pulse signal. Accordingly, in a preferred embodiment, before performing a write operation to a memory cell, the write pulse signal is fired (e.g., transitions from a low voltage level to a high voltage level) thereby causing the NFET to set the memory cell value to a high voltage level. Also, a WORD line associated with the port desiring to write data to the memory cell is fired, thereby turning on a memory access mechanism for such port. More specifically, the WORD line associated with such port is fired causing a NFET coupled to the BIT line of such port to turn on. The BIT line associated with such port is set to the value desired to be written to the memory cell. In a preferred embodiment, if the value of the BIT line is the same as the initial value to which the memory cell was initialized, then the memory access mechanism enables the memory cell to remain at such initial value, thereby accomplishing the desired write. However, if the value of the BIT line is different than the initial value to which the memory cell was initialized, then the memory access mechanism transitions the memory cell from the initial value to the value of the BIT line.

More specifically, in a preferred embodiment, a write pulse is fired before performing a write operation to a memory cell, thereby causing an NFET to initialize the memory cell to a high voltage level. Also, the WORD line for a port is fired causing a NFET coupled to the BIT line of such port to turn on. When performing a write operation from a port, the BIT line of such port is set to the value desired to be written to the memory cell (i.e., a logic 1 or logic 0). Thus, if the BIT line is a low voltage level (i.e., a logic 0), then the NFET coupled to the BIT line discharges the memory cell to the low voltage level, thereby accomplishing a write of a logic 0 to the memory cell. However, if the BIT line is a high voltage level, then the NFET coupled to the BIT line does not discharge the memory cell, thereby accomplishing a write of a logic 1 to the memory cell (because the memory cell remains at a high voltage level).

Additionally, in a preferred embodiment, the memory access mechanism of a port (e.g., a NFET coupled to the port's BIT line) enables the port to read data from the memory cell. For example, in a preferred embodiment, the BIT line of a port is pre-charged to a high voltage level (i.e., a logic 1), and when desiring to perform a read operation for a port, the WORD line for such port is fired, thereby turning on the memory access mechanism of the port. If the data value of the memory cell is not a logic 1, then the memory access mechanism transitions the BIT line for the port to a low voltage level, thereby accomplishing a read of a logic 0 from the memory cell on the port. On the other hand if the data value of the memory cell is a logic 1, then the memory access mechanism does not transition the BIT line for the port to a low voltage level, thereby accomplishing a read of a logic 1 from the memory cell on the port. Therefore, if the write pulse is not fired then when the WORD line fired for a port, the port performs a read of the memory cell, in a preferred embodiment.

A preferred embodiment provides a multi-ported register structure that enables reliable writes to be performed in a low voltage, small device geometry process. More specifically, a preferred embodiment enables reliable writes to be performed in a low voltage, small device geometry process through a single memory access mechanism (e.g., a single NFET gate) for each port. Furthermore, a preferred embodiment provides a multi-ported register structure that enables reliable reads to be performed in a low voltage, small device geometry process through a single memory access mechanism (e.g., a single NFET gate) for each port. Additionally, a preferred embodiment avoids write margin problems encountered by prior art designs that require a NFET to write a weak 1 to the memory cell.

Therefore, in a preferred embodiment a write pulse mechanism (e.g., reset NFET) is implemented for a register structure. In addition, only one NFET is required to be implemented for each port to enable such port to write to the register structure. Furthermore, the NFET implemented for each port not only enables each port the capability of writing to the register structure, but also enables each port the capability of reading from the register structure in a preferred embodiment. Accordingly, the register structure of a preferred embodiment requires less circuitry to be implemented for each port to enable the port to perform a reliable write operation to a memory cell than for prior art implementations. Furthermore, less circuitry is required to be implemented for each port to enable the port to perform a reliable read operation of the memory cell than is required in prior art implementations. Because a small amount of circuitry is required to be implemented for each additional port coupled to a register structure, the advantages of a preferred embodiment are compounded as the number of write ports implemented for a register structure increases.

It should be appreciated that a technical advantage of one aspect of the present invention is that a register structure is provided that enables multiple ports to be coupled to the register structure for performing memory access thereof (e.g., a memory write operation and/or a memory read operation). Another technical advantage of one aspect of the present invention is that a register structure is provided that requires a relatively small number of components to be implemented for coupling a port to a memory cell for performing write operations. Accordingly, the surface area, cost, and complexity of the register structure is reduced below that typically required for prior art register structures. A further technical advantage of one aspect of the present invention is that a register structure is provided that requires a relatively small number of components to be implemented for coupling a port to a memory cell for performing read operations. In fact, in a preferred embodiment, no additional components are required beyond those implemented for enabling a port to perform a write operation to the memory cell to enable such port to perform a read operation from the memory cell. A further technical advantage of one aspect of the present invention is that a register structure is provided that enables reliable writes (and reliable reads) to be performed in a low voltage, small device geometry process. Still a further technical advantage of one aspect of the present invention is that a register structure is provided that requires a relatively small number of high-level lines (e.g., wires or metal traces) to be implemented for enabling a port to be capable of performing write operations to a memory cell. For instance, in a preferred embodiment, only two high-level lines (i.e., a BIT line and a WORD line) are required to be implemented for each port coupled to the register structure.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWING

For a more complete understanding of the present invention, and the advantages thereof, reference is now made to the following descriptions taken in conjunction with the accompanying drawing, in which.

DETAILED DESCRIPTION

Figure 4:
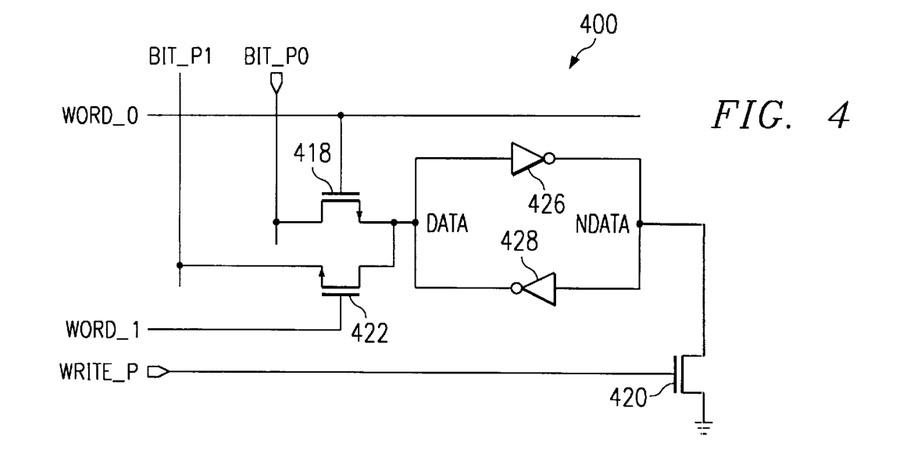
FIG. 4 shows an exemplary implementation of a preferred embodiment for a register structure.

Turning to FIG. 4, an exemplary implementation of a preferred embodiment of the present invention is illustrated. A preferred embodiment provides a register structure 400, which may be implemented as a SRAM memory cell or any other type of memory (e.g., any other RAM memory). As shown, a preferred embodiment implements a single-ended write structure that enables a full voltage level to be written from the data carrier (e.g., a BIT line) of a port without requiring a complementary data carrier (e.g., a NBIT line) to perform such a write. Therefore, a relatively few number of lines are required to be implemented for each port coupled to a register structure. Most preferably, the multi-ported register structure of FIG. 4 includes a SRAM cell 400 comprising cross-coupled inverters 426 and 428 for storing data (i.e., one bit of data) within the SRAM cell 400. The SRAM cell 400 of FIG. 4 is a memory cell capable of storing one bit of data (i.e., a logic 1 or a logic 0). Thus, many of such SRAM cells 400 are typically implemented within a system to provide the desired amount of SRAM memory.

In the exemplary implementation of FIG. 4, two ports (i.e., ports 0 and 1) are coupled to a SRAM memory cell 400. In the exemplary implementation of FIG. 4, either of the two ports coupled to the SRAM cell 400 may write data into the cell to satisfy a memory access request (e.g., a memory write request). More specifically, in the exemplary implementation of FIG. 4, data may be written into the register structure 400 from a first port (i.e., port 0) through the NFET 418, and data may be written from a second port (i.e., port 1) through NFET 422. As shown, BIT_P0 and WORD_0 lines are implemented to enable a write for port 0 to the SRAM cell 400, and BIT_P1 and WORD_1 lines are implemented to enable a write for port 1 to the SRAM cell 400. That is, a WORD_0 line is implemented for a first port (i.e., port 0), which controls NFET 418 to write data from the BIT_P0 line to the memory cell 400, and a WORD_1 line is implemented for a second port (i.e., port 1), which controls NFET 422 to write data from the BIT_P1 line to the memory cell 400.

Preferably, the BIT_P0 and BIT_P1 lines are held to a high voltage level (i.e., a logic 1), unless one of them is actively pulled to a low voltage level (i.e., a logic 0). In operation, when writing data from port 0 to the SRAM cell 400, the BIT_P0 line is actively driven low by an outside source (e.g., an instruction being executed by the processor) if the outside source desires to write a 0 to the SRAM cell 400. Otherwise, if an outside source desires to write a 1 to the SRAM cell 400, the BIT_P0 line remains high. Thereafter, the WORD_0 line is fired, at which time the value of the BIT_P0 line is written into the SRAM cell 400 via NFET 418. More specifically, the voltage level of BIT_P0 is transferred across NFET 418 to accomplish a write of the value of BIT_P0 to DATA of the cross-coupled inverters 426 and 428. Accordingly, the data value written into the SRAM cell 400 (e.g., a logic 0 or logic 1) is shown as DATA in FIG. 4, and the complement of such value is shown as NDATA.

The multi-ported register of FIG. 4 also includes NFET 422, which is implemented for port 1 to enable port 1 to write data to the memory cell 400. As shown, BIT_P1 and WORD_1 lines are implemented for port 1. The WORD_1 line controls NFET 422 to write data from the BIT_P1 line to the memory cell 400. In operation, when writing data from port 1 to the SRAM cell 400, the BIT_P1 line is actively driven low by an outside source (e.g., an instruction being executed by the processor) if the outside source desires to write a 0 to the SRAM cell 400. Otherwise, if an outside source desires to write a 1 to the SRAM cell 400, the BIT_P1 line remains high. Thereafter, the WORD_1 line is fired, at which time the value of the BIT_P1 line is written into the SRAM cell 400 via NFET 422. More specifically, the voltage level of BIT_P1 is transferred across NFET 422 to accomplish a write of the value of BIT_P1 to DATA of the cross-coupled inverters 426 and 428.

As further shown in FIG. 4, a preferred embodiment includes a reset FET (i.e., NFET 420), which is controlled by a write pulse line (i.e., WRITE_P). In a preferred embodiment, WRITE_P controls the NFET 420 to provide a reset mechanism that resets NDATA to zero at the beginning of a write operation. That is, the WRITE_P line is fired just before a write occurs to reset NDATA of the cross-coupled inverters 426 and 428 to 0. Thus, in a preferred embodiment, the WORD line FET for a port (e.g., NFET 418 for port 0 and NFET 422 for port 1) are not used to attempt to set the memory cell (i.e., DATA) to a high voltage value, but instead are only used to reset the memory cell (i.e., DATA) to a low voltage value during a write operation. Accordingly, the WORD line NFET for a port is not required to write a weak one (a weak high voltage level) to DATA of the cross-coupled inverters 426 and 428, but instead the WORD line NFET for a port is only used to write a zero to DATA of the cross-coupled inverters 426 and 428.

As an example, suppose that a write operation is desired for port 0. Just before the write operation is performed, the WRITE_P line is fired (e.g., transitions to a high voltage level), which causes the reset NFET 420 to reset NDATA of the cross-coupled inverters 426 and 428 to a low voltage level (i.e., a logic 0), thereby causing DATA of the cross-coupled inverters 426 and 428 to be set to a high voltage level (i.e., a logic 1). The data on the BIT_P0 line needs to be stable to the value to be written to the SRAM cell 400 (i.e., stable to either a 0 or a 1), and then the WORD_0 line is fired. If the data of BIT_P0 is a 1, the DATA side is already a 1 due to the reset mechanism of the structure. Accordingly, the WORD_0 line NFET 418 is not required to drive a weak 1 to DATA of the cross-coupled inverters 426 and 428. If the data of BIT_P0 is a 0, the DATA side is reset to 0 by the WORD_0 line NFET 418. If a late write is going to occur, the BIT_P0 line must be pre-charged high and pulled low. The NFET transfer gate 418 can only reliably write a 0, so the "high, go low" nature of the BIT_P0 line is important to a preferred embodiment. Otherwise the NFET 418 would be trying to drive a weak one into the latch and would likely fail to do so in a small device geometry process.

Figure 5:
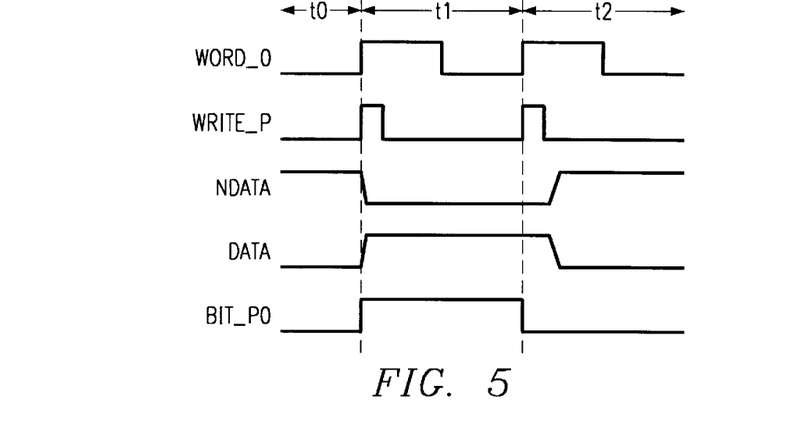
FIG. 5 shows exemplary wave forms for a write operation to a register structure of a preferred embodiment.

To further illustrate the operation of a preferred embodiment, exemplary wave forms are provided in FIG. 5 for a write operation from port 0 to a memory cell 400. The wave forms of FIG. 5 illustrate the WORD_0, WRITE_P, NDATA, DATA, and BIT_P0 lines. For example, suppose the processor is executing an instruction desiring to write a 1 into the memory cell 400, and further suppose that such 1 is to be written to the memory cell 400 via port 0. At time $T_0$ the memory cell is at a steady state, wherein WORD_0 and WRITE_P are at a low voltage level and BIT_P0 is pre-charged to a high voltage level. In the example of FIG. 5, DATA is initially a low voltage level and NDATA is initially a high voltage level at time $T_0$. When time $T_1$ comes along, the WORD_0 line goes high, thereby opening (turning on) NFET 418, and the write pulse WRITE_P transitions high for a short period of time (e.g., pulses high), thereby turning on reset NFET 420. In a most preferred embodiment, the WRITE_P line transitions high for approximately 100 to 150 picoseconds. Because WRITE_P pulses high turning reset NFET 420 on, NDATA is reset to 0 (a low voltage level), which causes DATA to transition to a 1 (a high voltage level) in time $T_1$. Because a 1 is desired to be written to the register structure, the BIT_P0 line remains at a high voltage level (i.e., a 1) at time $T_1$. After the write pulse WRITE_P transitions low (i.e., completes its pulse), the WORD_0 line remains high, thereby keeping NFET 418 of FIG. 4 open. Since BIT_P0 is high, the NFET 418 does not discharge the DATA line (i.e., no charge is transferred across NFET 418), and the write operation is complete. Therefore, during time $T_1$ the NDATA line is reset to 0 causing the DATA line to be a 1, which is the value intended to be written to the register structure.

As a further example, suppose now that at time $T_2$ the processor is executing an instruction desiring to write a 0 into the memory cell 400, and further suppose that such 0 is to be written to the memory cell 400 via port 0. Accordingly, because a 0 is desired to be written to the register structure, at time $T_2$ the BIT_P0 line is discharged to a low voltage level (i.e., a logic 0). The WORD_0 line then goes high, thereby opening (turning on) NFET 418, and the write pulse WRITE P pulses high, thereby turning on reset NFET 420. When WRITE P pulses high at time $T_2$ turning reset NFET 420 on, NDATA is already a low voltage level. Therefore, the WRITE_P has no effect on the NDATA line. After the write pulse WRITE_P transitions low (i.e., completes its pulse), the WORD_0 line remains high, thereby keeping NFET 418 of FIG. 4 open. Since BIT_P0 is low, the NFET 418 discharges the DATA line (i.e., a charge is transferred across NFET 418) to a low voltage level, which in turn causes the NDATA line to transition to a high voltage level. As soon as the NDATA line transitions to a high voltage level, the write operation is complete. Therefore, during time $T_2$ the DATA line is reset to 0 causing the NDATA line to be a 1, which results in the value intended to be written to the register structure (i.e., a logic 0) to be written to the DATA line of the cross-coupled inverters 426 and 428.

Multiple register structures, such as SRAM cell 400, may be connected to a single BIT line (e.g., BIT_P0). Accordingly, a single BIT line may be utilized to carry data to/from multiple ones of SRAM cells 400 for a port. Therefore, even though only SRAM cell 400 is shown, it should be understood that many such SRAM cells may be connected to the BIT_P0 line for port 0, as well as to the BIT_P1 line for port 1, to form a group of SRAM cells.

Additionally, it should be recognized that additional ports may be coupled to the SRAM cell 400. Thus, even though only two ports (port 0 and port 1) are shown as being coupled to SRAM cell 400, SRAM cell 400 may have any number of ports coupled thereto, and any such implementation is intended to be within the scope of the present invention. In general, it is desirable to have a large number of ports coupled to each SRAM cell 400 in order to increase the number of instructions that may be processed in parallel, and thereby increase the efficiency of a system.

A single-ended register structure, as implemented in FIG. 4, is generally more desirable than a dual-ended register structure because one less line is required to perform a write for each port. That is, only a BIT line, as opposed to both a BIT and NBIT line, is required to perform a write from a port to a memory cell 400. Furthermore, the prior art multi-ported register structure of FIG. 4 requires a relatively small amount of circuitry to be implemented to couple each port for writing to the memory cell 400. More specifically, the prior art solution of FIG. 4 only requires one FET and two lines to be implemented for each port coupled to the SRAM cell 400 to perform write operations. For example, only one FET (i.e., NFET 422) is required to be implemented to enable port 1 to be coupled to the SRAM cell 400 for write operations. Additionally, wires or metal traces must only be implemented for two lines for port 1 (i.e., BIT_P1 and WORD_1). Therefore, if a third port were 20 implemented for the SRAM cell 400, only one additional FET and only two additional lines (i.e., BIT_P2 and WORD_2) would be required to be added to the design of FIG. 4. As a result, the multi-ported structure of a preferred embodiment is a more desirable implementation than prior art solutions because it requires a fewer number of components and lines to be implemented for each port coupled to the SRAM cell 400. Therefore, multiple ports can be coupled to the structure of FIG. 4 in a manner that is less costly and consumes less surface area than in prior art solutions.

Turning back to the prior art implementation shown in FIG. 1A, to add additional ports to that design, two additional FETs and three additional high-level lines are required to be implemented for each additional port to enable each port the capability of writing data to the register structure 100. Thus, if four ports are implemented in the design of FIG. 1A, for example, a total of 12 high-level lines and eight FETs are required to enable such four ports to write data to the cross-coupled inverters 126 and 128. In the prior art implementation shown in FIG. 1B, two FETs, one inverter, and two high-level lines are required to be implemented for each port to enable each port the capability of writing to the register structure 150. Thus, if four ports are implemented in the design of FIG. 1B, for example, a total of 8 high-level lines, eight FETs, and four inverters are required to enable such four ports to write data to the cross-coupled inverters 126 and 128. In the prior art implementation of FIG. 2, two high-level lines, two FETs, and one inverter are required to be implemented for each port to enable each port the capability of writing to the register structure 200. Thus, if four ports are implemented in the design of FIG. 2, for example, a total of eight high-level lines, eight FETs, and four inverters are required to enable such four ports to write data to the cross-coupled inverters 126 and 128.

However, in a preferred embodiment of the present invention, only two high-level lines and one FET is required to be implemented for each port added for a register structure 400 to enable each port the capability of writing data to the register structure 400. Thus, if four ports are implemented in a preferred embodiment, for example, only eight high-level lines and four FETs are required to enable such four ports to write data to the cross-coupled inverters 426 and 428. Of course, as shown in FIG. 4, one reset FET 420 is also required in the register structure, but such reset FET 420 is not required to be duplicated for each port implemented for the register structure 400. In view of the above, a preferred embodiment requires much fewer components to be implemented for each port coupled to a register structure 400 in order to enable such ports the capability of writing data to the register structure 400. Accordingly, a preferred embodiment requires less surface area and less cost to implement additional ports in the design than is required in multi-ported register structures of the prior art. Therefore, in a preferred embodiment, additional ports may be implemented within a multi-ported register structure design with less additional area, less complexity, and less cost required for such implementation. Additionally, a preferred embodiment is more advantageous than the prior art design of FIG.

3 because a preferred embodiment enables reliable writes to be accomplished in small device geometry processes. That is, a preferred embodiment does not attempt to write a weak 1 through a NFET to the memory cell of a register structure. Accordingly, a preferred embodiment is more desirable than prior art designs that utilize a single NFET for performing a write operation, such as FIG. 3, because a preferred embodiment enables reliable writes in small device geometry processes.

Furthermore, the prior art multi-ported register designs of FIGS. 1B, 2, and 3, require additional circuitry to be implemented to enable a read operation to be performed by a port coupled to the register structure. Therefore, to enable ports of a multi-ported register structure of the prior art the capability of performing read operations, additional components (e.g., additional FETs) are required to be implemented for each port, thereby further increasing the amount of surface area, cost, and complexity associated with such prior art register structure. However, the multi-ported register structure of a preferred embodiment enables both read and write operations to be performed for a port utilizing the same FET (e.g., NFET 418 of FIG. 4). Accordingly, additional circuitry is not required to be added to allow each port to perform a read operation, in a preferred embodiment.

Figure 6:
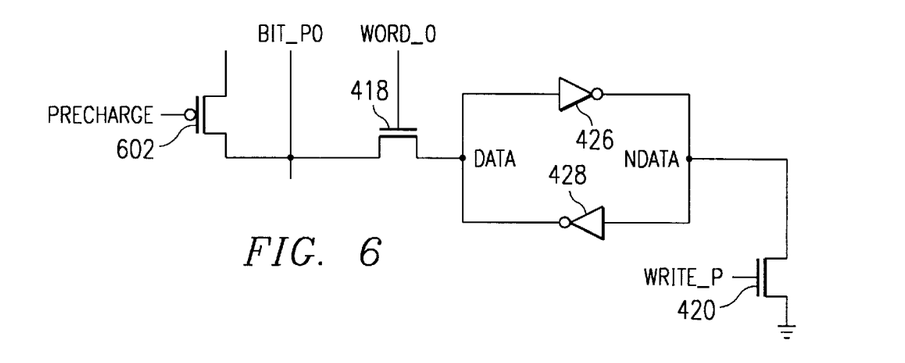
FIG. 6 shows an exemplary implementation of a preferred embodiment for a register structure that enables both read and write operations for a port coupled to such register structure.

Turning to FIG. 6, the read mechanism of a preferred embodiment is illustrated. More specifically, FIG. 6 illustrates the circuitry of a preferred embodiment utilized to enable a read for a first port (i.e., port 0) that is coupled to the register structure 400. It should be understood, that multiple other ports may be implemented in a similar manner. As in FIG. 4, the register structure 400 is shown including the cross-coupled inverters 426 and 428 for storing data (i.e., storing one bit of data). The register structure 400 also includes the WORD_0 line, the BIT_P0 line, the WRITE_P line, NFET 418 and reset NFET 420 arranged as in FIG. 4. FIG. 6 further illustrates that the BIT_P0 line is pre-charged high via pre-charge PFET 602.

In a preferred embodiment, if the write pulse WRITE_P stays low when the WORD_0 line is fired, then a read operation occurs for port 0. More specifically, when the WORD_0 line transitions high, NFET 418 opens up (i.e., is turned on). If DATA is low, the BIT_P0 line is discharged from its pre-charged high voltage level through NFET 418 to a low voltage value. On the other hand, if DATA is high, then the BIT_P0 line remains high. More specifically, the WORD_0 fires causing NFET 418 to turn on, but because the DATA value is a high voltage level, no charge is transferred across the NFET 418, thereby allowing the BIT_P0 line to remain at a high voltage level. Therefore, when the WORD_0 line fires and the WRITE_P line does not pulse, the BIT_P0 line is set to the DATA value of the register structure 400, thereby enabling such DATA value to be read out of the register structure 400 via the BIT_P0 line. The BIT_P0 line, which indicates the value read from the register structure, can then be received by an inverter or some other kind of receiver mechanism.

When the PRECHARGE line transitions high turning pre-charge PFET 602 on, the BIT_P0 line is pre-charged high and it is then ready for another read or write operation to be performed.

Figure 7:
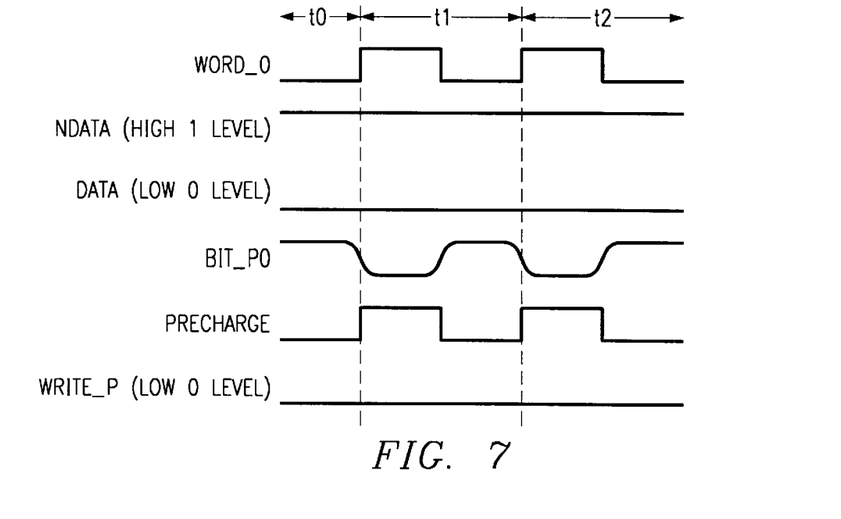
FIG. 7 shows exemplary wave forms for a read operation from a register structure of a preferred embodiment.

To further illustrate the operation of a preferred embodiment, exemplary wave forms are provided in FIG. 7 for a read operation for port 0 from a memory cell 400. The wave forms of FIG. 7 illustrate the WORD_0, NDATA, DATA, BIT_P0, PRECHARGE, and WRITE_P lines of FIG. 6. For example, suppose the processor is executing an instruction desiring to read the value of the memory cell 400 (i.e., DATA), and further suppose that such DATA value is to be read from the memory cell 400 via port 0. At time $T_0$ the memory cell is at a steady state, wherein WORD_0 and WRITE_P are at a low voltage level and the BIT_P0 is pre-charged to a high voltage level. That is, the PRECHARGE line is low at time $T_0$, thereby causing PFET 602 to be turned on to hold the BIT_P0 line to a high voltage level. In the example of FIG. 7, the DATA value of the register structure 400 is 0 (i.e., a low voltage level), and therefore NDATA is 1 (i.e., a high voltage level).

At time $T_1$, an instruction requests a read of register structure 400, and such read is to be performed via port 0. Therefore, the WORD_0 line transitions to a high voltage level (fires), thereby turning NFET 418 on, and the PRECHARGE line transitions to a high voltage level, thereby turning the pre-charge PFET 602 off. Additionally, WRITE_P remains at a low voltage level, thereby causing NFET 420 to remain turned off. Because the DATA value stored in the register structure 400 is 0 (i.e., a low voltage level), the BIT_P0 line, which is no longer being held high by pre-charger PFET 602, discharges through NFET 418 to a low voltage level. That is, because DATA is a low voltage level, BIT_P0 discharges to a low voltage level. DATA and NDATA of the register structure 400 maintain their states (or values) during the read operation. Once the BIT_P0 line transitions to a low voltage value, the read operation is complete, and such BIT_P0 line may be received by a receiver circuitry to then satisfy the instruction's read request. Once the read operation is complete, the WORD_0 line transitions to a low voltage level, and the PRECHARGE line transitions low, thereby turning on PFET 602 and charging BIT_P0 to a high voltage level.

At time $T_2$, another instruction requests a read of register structure 400, and such read is to be performed via port 0. Therefore, the WORD_0 line transitions to a high voltage level (fires), thereby turning NFET 418 on, and the PRECHARGE line transitions to a high voltage level, thereby turning the pre-charge PFET 602 off. Additionally, WRITE_P remains at a low voltage level, thereby causing NFET 420 to remain turned off. Because the DATA value stored in the register structure 400 is 0 (i.e., a low voltage level), the BIT_P0 line, which is no longer being held high by pre-charger PFET 602, discharges through NFET 418 to a low voltage level. That is, because DATA is a low voltage level, BIT_P0 discharges to a low voltage level. DATA and NDATA of the register structure 400 maintain their states (or values) during the read operation. Once the BIT_P0 line transitions to a low voltage value, the read operation is complete, and such BIT_P0 line may be received by a receiver circuitry to then satisfy the instruction's read request. Once the read operation is complete, the WORD_0 line transitions to a low voltage level, and the PRECHARGE line transitions low, thereby turning on PFET 602 and charging BIT_P0 to a high voltage level.

In a most preferred embodiment four ports are coupled to a single register structure. However, it should be understood that any number of ports may be coupled to a single register structure in accordance with a preferred embodiment of the present invention, and any such implementation is intended to be within the scope of the present invention. Furthermore, it should be understood that a multi-ported register structure of a preferred embodiment may be implemented within any type of computer system, including but not limited to a personal computer (PC), laptop computer, and personal data assistant (e.g., a palmtop PC). Moreover, it should be understood that a register structure of a preferred embodiment may be implemented within any type of device that includes a register structure (e.g., that includes a CMOS SRAM structure), including but not limited to telephones, televisions, VCRs, DVDs, automobile systems, and video games.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of performing a memory access from a port to a register structure, said method comprising:

receiving a memory access request, wherein said memory access request is a memory write from a port coupled to a register structure;

setting a data carrier for said port to a desired value to be written to a memory cell of said register structure;

triggering a reset mechanism to set said memory cell of said register structure to a first value in response to said receiving a memory access request;

and triggering a memory access mechanism for said port to transition said memory cell from said first value to said desired value if said first value and said desired value are not the same.

2. The method of claim 1 wherein said reset mechanism is a FET capable of setting said memory cell to a high voltage value.

3. The method of claim 2 wherein said triggering includes firing a write pulse to control said FET to set said memory cell to a high voltage value.

4. The method of claim 1 wherein said memory cell is a SRAM memory cell.

5. The method of claim 1 wherein said memory cell includes cross-coupled inverters for storing a bit of data.

6. The method of claim 1 further including:

receiving another memory access request, wherein said another memory access request is a memory read for said port coupled to said register structure;

setting said data carrier for said port to an initial value; and triggering said memory access mechanism for said port to transition said data carrier for said port to the value of said memory cell if said initial value and said value of said memory cell are not the same.

7. A register structure comprising:

a memory cell capable of storing one bit of data;

means, responsive to a first port desiring to perform a memory write operation to said memory cell, for setting said memory cell to a first value before performing said memory write operation to said memory cell; and first means for transitioning said memory cell to a second value desired to be written to said memory cell by said first port if said second value is not the same as said first value.

8. The register structure of claim 7 wherein said setting means includes a reset NFET that sets said memory cell to a high voltage value before performing said write operation to said memory cell.

9. The register structure of claim 8 wherein said first transitioning means includes a NFET arranged to discharge the memory cell to a low voltage value if said second value desired to be written to said memory cell by said first port is a low voltage value.

10. The register structure of claim 7 further including:

second means, responsive to a second port desiring to perform a memory write operation to said memory cell, for setting said memory cell to a first value before performing said memory write operation to said memory cell; and second means for transitioning said memory cell to a second value desired to be written to said memory cell by said second port if said second value is not the same as said first value.

11. The register structure of claim 10 wherein said setting means and said second setting means are the same.

12. The register structure of claim 11 wherein said setting means and said second setting means includes a reset NFET that sets said memory cell to a high voltage value before performing a write operation to said memory cell from said first or said second port.

13. The register structure of claim 10 wherein said second transitioning means includes a NFET arranged to discharge the memory cell to a low voltage value if said second value desired to be written to said memory cell by said second port is a low voltage value.

14. The register structure of claim 7 wherein said memory cell is implemented to enable a single-ended write operation thereto.

15. The register structure of claim 7 wherein said memory cell is a SRAM cell.

16. The register structure of claim 7 further including:

one reset FET coupled to said memory cell to set said memory cell to a high voltage value before performing a write operation to said memory cell; and N number of FETs coupled to said memory cell to enable N number of ports the capability of writing to said memory cell, wherein one of said N number of FETs is capable of discharging said memory cell for writing a low voltage value to the memory cell from one of said N ports associated with said one FET.

17. The register structure of claim 7 wherein said first transitioning means is arranged to transition a data carrier for said first port to the value of said memory cell if said data carrier is not the same value as said value of said memory cell, thereby enabling said first port to read the value of said memory cell.

18. A system comprising:
- at least one processor for executing instructions;
- at least one port capable of servicing an instruction being executed by said processor;
- a register structure, wherein said register structure comprises a memory cell capable of storing one bit of data, a reset mechanism capable of setting said memory cell to a high voltage value before performing a write operation to said memory cell, and a first transfer gate capable of discharging said memory cell to a low voltage value when writing a logic 0 to said memory cell from a first port.

19. The system of claim 18 wherein said register structure further includes:
- a second transfer gate capable of discharging said memory cell to a low voltage value when writing a logic 0 to said memory cell from a second port.

20. The system of claim 18 wherein said first transfer gate is capable of discharging a data carrier for said first port to a low voltage value if the value of said memory cell is a low voltage value, otherwise allowing said data carrier for said first port to remain at a high voltage value if said value of said memory cell is a high voltage value, thereby enabling said first port to read the value of said memory cell via said first transfer gate.

* * * * *